(12) United States Patent
Zozgornik

(10) Patent No.: US 10,746,365 B2
(45) Date of Patent: Aug. 18, 2020

(54) LASER LIGHTING MODULE FOR VEHICLE HEADLIGHT

(71) Applicant: Lumileds LLC, San Jose, CA (US)

(72) Inventor: Steffen Zozgornik, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/470,898

(22) PCT Filed: Dec. 12, 2017

(86) PCT No.: PCT/EP2017/082404
§ 371 (c)(1),
(2) Date: Jun. 18, 2019

(87) PCT Pub. No.: WO2018/114479
PCT Pub. Date: Jun. 28, 2018

(65) Prior Publication Data
US 2020/0088372 A1 Mar. 19, 2020

(30) Foreign Application Priority Data
Dec. 19, 2016 (EP) ..................................... 16204970

(51) Int. Cl.
*B60Q 1/00* (2006.01)
*F21S 41/16* (2018.01)
*F21S 41/20* (2018.01)

(52) U.S. Cl.
CPC ............. *F21S 41/16* (2018.01); *F21S 41/285* (2018.01)

(58) Field of Classification Search
None
See application file for complete search history.

(56) References Cited

U.S. PATENT DOCUMENTS

2014/0362600 A1* 12/2014 Suckling ............... F21S 41/176
362/583
2015/0308636 A1 10/2015 Daniels
2017/0350562 A1 12/2017 Khrushchev et al.

FOREIGN PATENT DOCUMENTS

DE 102014223510 A1 5/2016
WO 2011098164 A1 8/2011
WO 2012154116 A1 11/2012
(Continued)

OTHER PUBLICATIONS

EPO as ISA, PCT/EP2017/082404 filed Dec. 12, 2017, "International Search Report and Written Opinion", dated Mar. 20, 2018, 16 pages.

(Continued)

*Primary Examiner* — Vip Patel

(57) ABSTRACT

The invention describes a laser lighting module for a vehicle headlight comprising a laser for emitting laser light, a light conversion device, and a holographic optical device for transforming part of the laser light to first transformed laser light and focusing that on the light conversion device for converting the first transformed laser light to converted light. The holographic optical device is transparent to the converted light, and transforms another part of the laser light to second transformed laser light which is mixed with the converted light after the latter has been transmitted through the holographic optical device.
The invention further describes a vehicle headlight comprising at least one such laser lighting module.

4 Claims, 5 Drawing Sheets

(56) References Cited

FOREIGN PATENT DOCUMENTS

WO      2016120054 A1    8/2016
WO      2016188744 A1    12/2016

OTHER PUBLICATIONS

Extended European Search Report dated Jul. 4, 2017, European Patent Application No. 16204970.4, 8 pages.

* cited by examiner

LASER LIGHTING MODULE FOR VEHICLE HEADLIGHT

CROSS-REFERENCE TO RELATED APPLICATIONS

The present application is a § 371 application of International Application No. PCT/EP2017/082404 filed on Dec. 12, 2017 and titled "LASER LIGHTING MODULE FOR VEHICLE HEADLIGHT," which claims the benefit of European Patent Application No. 16204970.4 filed on Dec. 19, 2016. International Application No. PCT/EP2017/082404 and European Patent Application No. 16204970.4 are incorporated herein.

FIELD OF THE INVENTION

The invention relates to a laser lighting module for a vehicle headlight and a vehicle headlight comprising the laser lighting module.

BACKGROUND OF THE INVENTION

In a laser based white light source and especially in vehicle headlights, the light coming from the source (laser diode) has to be focused onto a light conversion device comprising a light converter like a phosphor. Usually, aspheric lenses are used for focusing. Additional optical elements (scattering device, lens array, mixing rod) are needed to shape the spot and the intensity distribution. The optical arrangement and alignment of the different optical elements is costly and limits miniaturization of the laser-based light source.

As an alternative to traditional lens collimators WO2012154446A1 mentions the possibility of using diffractive optical elements.

SUMMARY OF THE INVENTION

It is an object of the present invention to provide a compact laser lighting module.

According to a first aspect a laser lighting module for a vehicle headlight is provided. The laser lighting module comprises:
at least one laser, wherein the at least one laser is adapted to emit laser light,
a holographic optical device, and
a light conversion device,
wherein
the holographic optical device is arranged to transform at least a part of the laser light to first transformed laser light such that the first transformed laser light is focused on the light conversion device, and such that a predefined intensity distribution of the laser light is provided by means of the first transformed laser light on the light conversion device, and
the light conversion device comprising a light converter, wherein the light converter is adapted to convert the first transformed laser light to converted light, wherein a peak emission wavelength of the converted light is in a longer wavelength range than a laser peak emission wavelength of the first transformed laser light.

A hologram is known as a 3 dimensional image of an object, but in technical perspective it is a recorded intensity distribution of light in space. If a hologram of an illuminated surface is recorded and then reconstructed in the same geometry, it is illuminating the surface in the same way. So a holographic optical device comprising such a hologram can be used to illuminate a light conversion device comprising a light converter (e.g. phosphor like, for example, Cerium doped phosphor garnet YAG:Ce) in a tailored way. The tailored intensity distribution on a light receiving surface of the light conversion device enables a tailored light distribution of converted light emitted by the light conversion device. The holographic optical device acts as collimating lens and light shaping unit at once. It is thus possible to avoid separate optical devices like aspheric lenses for focusing in combination with scattering devices, lens arrays, and/or mixing rods for providing the desired intensity distribution. The laser lighting module comprising such an optical holographic device can therefore be more compact as conventional laser lighting modules. Furthermore, the effort to align such multiple optical devices is reduced.

Holograms can be exposed directly by recording the illuminated surface as discussed above, or they may be generated by means of a computer (e.g. calculated diffractive structure).

The holographic optical device is arranged in an emission path of the converted light emitted by the light conversion device. The holographic optical device is transparent with respect to the converted light.

The holographic optical device could be a transmissive or reflective element. The holographic optical device may, for example, be a volume grating diffracting the laser light such that the intended focusing and light distribution of the (blue) laser light is enabled on the light converter. The holographic optical device could in this case be arranged such that it is transparent for light from other directions or with different wavelengths such as the converted (yellow) light. The holographic optical device can therefore be placed in an optical path of the converted light. This arrangement may enable a very compact laser lighting module.

The laser and the light conversion device may in an embodiment be arranged on a same first side of the holographic optical device. The holographic optical device is arranged to reflect the laser light as the first transformed laser light to the light conversion device. The holographic optical device is in this case arranged as a reflective element which at the same time focuses the laser light to the light conversion device with a predetermined intensity distribution. Lenses, scattering devices and the like, being used for beam shaping and focusing of the laser light, in the optical path of the converted light would also influence the converted light and have thus to be avoided. The arrangement of such a reflective holographic optical device (with respect to the laser light), which is at the same time transparent with respect to the converted light, in the optical path of the converted light enables an even more compact laser lighting module in comparison to conventional approaches. The light conversion device may, for example, be arranged to convert essentially all first transformed laser light received from the holographic optical device. The converted light may be emitted via the holographic optical device and subsequently combined with light with, for example, the same wavelength as the laser light.

The holographic optical device is further arranged to transform at least another part of the laser light to second transformed laser light. Such second transformed laser light, in one embodiment, may traverse the holographic optical device. The holographic optical device is arranged such that a mixture of the second transformed laser light and the converted laser light leaves a second side of the holographic optical device opposite to the first side.

The holographic optical device would in this case be only partly reflective with respect to the laser light. A first part is reflected and transformed to first transformed laser light which is focused with the desired intensity distribution on the light conversion device. A second part of the laser light is transmitted via the holographic optical device and interacts with the hologram comprised by the holographic optical device such that second transformed laser light is emitted via the second surface of the holographic optical device which is opposite to the first surface. The second transformed (e.g. blue) laser light can be combined with the (yellow) converted light traversing the holographic optical device. A mixture of blue laser light and yellow converted light may, for example, be used to emit white light which may be used in a vehicle headlight.

The holographic optical device may be arranged such that a light distribution of the second transformed laser light coincides with a light distribution of the converted laser light traversing the holographic optical device.

The light conversion device may emit the converted light in accordance with Lambert's cosine law. Subsequent manipulation of mixed light comprising second transformed laser light and the converted light may be simplified if the holographic optical device is arranged to adapt the light distribution of the second transformed laser light to the light distribution of the light conversion device. The holographic optical device is in this case arranged such that the second transformed laser light seems to be emitted by the same surface with essentially the same intensity distribution as the converted light. The hologram comprised by the holographic optical device has in this case to be recorded by means of two illuminated surfaces wherein the first illuminated surface provides the intensity distribution required at the light conversion device and the second illuminated surface provides the intensity distribution required, for example, at a defined distance behind the second surface of the holographic optical device.

The light conversion device may according to an alternative embodiment be arranged on a first side of the holographic optical device. The laser is in this case arranged on a second side of the holographic optical device, wherein the second side is opposite to the first side. The holographic optical device is arranged to transmit the laser light as the first transformed laser light to the light conversion device.

The holographic optical device is in this case a transmissive element which transforms the part of the laser light transmitted via the holographic optical device to the first transformed laser light.

The laser lighting module may comprise a reflective structure. The reflective structure may be arranged such that at least a part of the laser light is reflected prior to being transformed by the holographic optical device. The laser lighting module is arranged to emit a mixture of reflected laser light and converted laser light.

The reflective structure may, for example, be a semi-transmissive mirror which is arranged in an optical path between the laser and the holographic optical device. A first part of the laser light is reflected by the semi-transmissive mirror and the other second part is transmitted to the holographic optical device which transforms the second part to first transformed laser light. The reflective structure may alternatively be a coating on the second surface of the holographic optical device, or the second surface may be arranged to reflect a defined part of the laser light. The reflective structure may, for example, be (essentially) transparent with respect to the converted light (e.g. a narrowband dichroic mirror) or the reflective structure may be arranged outside the optical path of the converted light.

The holographic optical device is arranged to transform at least a part of the laser light to second transformed laser light. In a particular embodiment, such second transformed light is reflected by the holographic optical device. The holographic optical device is arranged such that a mixture of second transformed laser light and converted laser light leaves the second side of the holographic optical device opposite to the first side.

The holographic optical device may especially be arranged such that a light distribution of the second transformed laser light coincides with a light distribution of the converted laser light traversing the holographic optical device.

The holographic optical device may in this case similar as discussed above with respect to the reflective approach be arranged to provide the first transformed laser light which is in this case transmitted via the holographic optical device and the second transformed laser light which is in this case reflected by the holographic optical device. The general principle is in both cases the same such that the explanation provided above with respect to the "reflective" approach (laser and light conversion device on the same side of the holographic optical device) also applies to the "transmissive" approach (laser and light converting device on different sides of the holographic optical device).

A laser lighting module may comprise two, three, four or more lasers (e.g. in the form of an array) emitting, for example, blue laser light. A laser-based light source may comprise two, three, four or more laser lighting modules.

According to a further aspect a vehicle headlight is provided. The vehicle headlight comprises at least one laser lighting module as described above. The vehicle headlight further comprises imaging optics to image light received from the laser lighting module. The vehicle headlight may comprise two, three, four or more laser lighting modules as described above.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first not claimed laser lighting module.

FIG. 2 shows a principal sketch of a second not claimed laser lighting module.

FIG. 3 shows a principal sketch of a first embodiment of an inventive laser lighting module.

FIG. 4 shows a principal sketch of a second embodiment of an inventive laser lighting module.

FIG. 5 shows a principal sketch of a third embodiment of an inventive laser lighting module.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
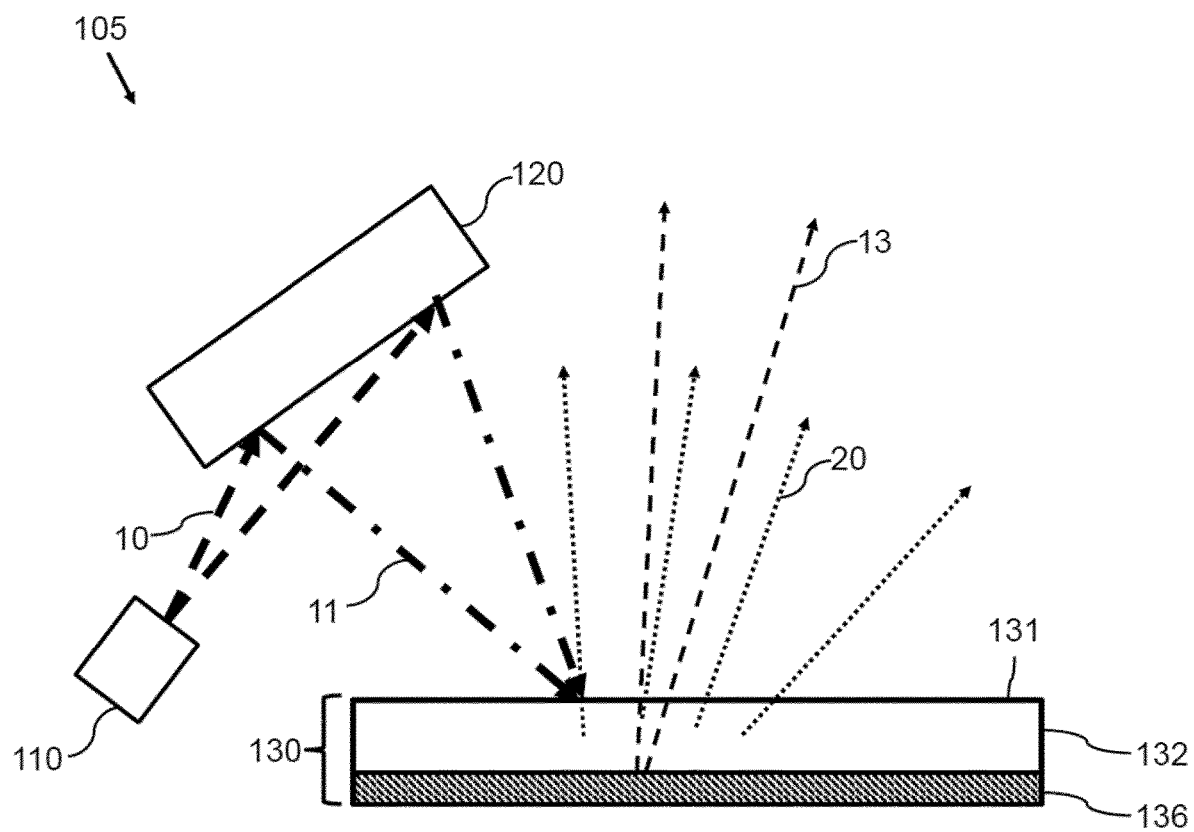

FIG. 1 shows a principal sketch of a first not claimed laser lighting module 105. A laser 110 emits laser light 10 to a holographic optical device 120 which reflects and transforms the entire laser light 10 to first transformed laser light 11. The first transformed laser light 11 is focused and imaged by means of the holographic optical device 120 on a light conversion device 130. The light conversion device 130 comprises a light converter 132 and a reflective back structure 136. The light converter 132 is a thin sheet (e.g. thickness of 50 μm) of a yellow garnet phosphor YAG:Ce (e.g. $Y_{(3-0.4)}Gd_{0.4}Al_5O_{12}$:Ce) which is arranged to convert blue light to yellow light. The first transformed laser light 11 illuminates a light emission surface 131 of the light converter 132 with a predetermined intensity pattern such that a predetermined intensity pattern of converted light 20 is generated. The light conversion device 130 further comprises a reflective back structure 136 which is arranged to reflect at least the transformed laser light 11 and preferably the converted light 20. The conversion device is arranged such that around 21% of the blue first transformed laser light 11 is emitted via light emission surface 131. The remaining blue first transformed laser light 11 is converted by means of the light conversion device 130 and emitted via the light emission surface 131. This enables a ratio of 26% blue laser light and 74% yellow converted light taking into account, for example, Stokes losses in the phosphor such that the mixture of reflected laser light 13 and converted light 20 results in white light.

The laser 110 may optionally be arranged such that a first part of the laser light 10 is emitted to the holographic optical device 120 and a second part is redirected by means of optical devices like mirrors such that the holographic optical device 120 may be fully reflective with respect to laser light 10 but essentially transmissive with respect to converted light 20. The converted light 20 may be emitted via the holographic optical device 12 as described, for example, with respect to FIG. 3 below. The converted light 20 may be combined with the second part of the laser light 10 in order to get white light.

Figure 2:
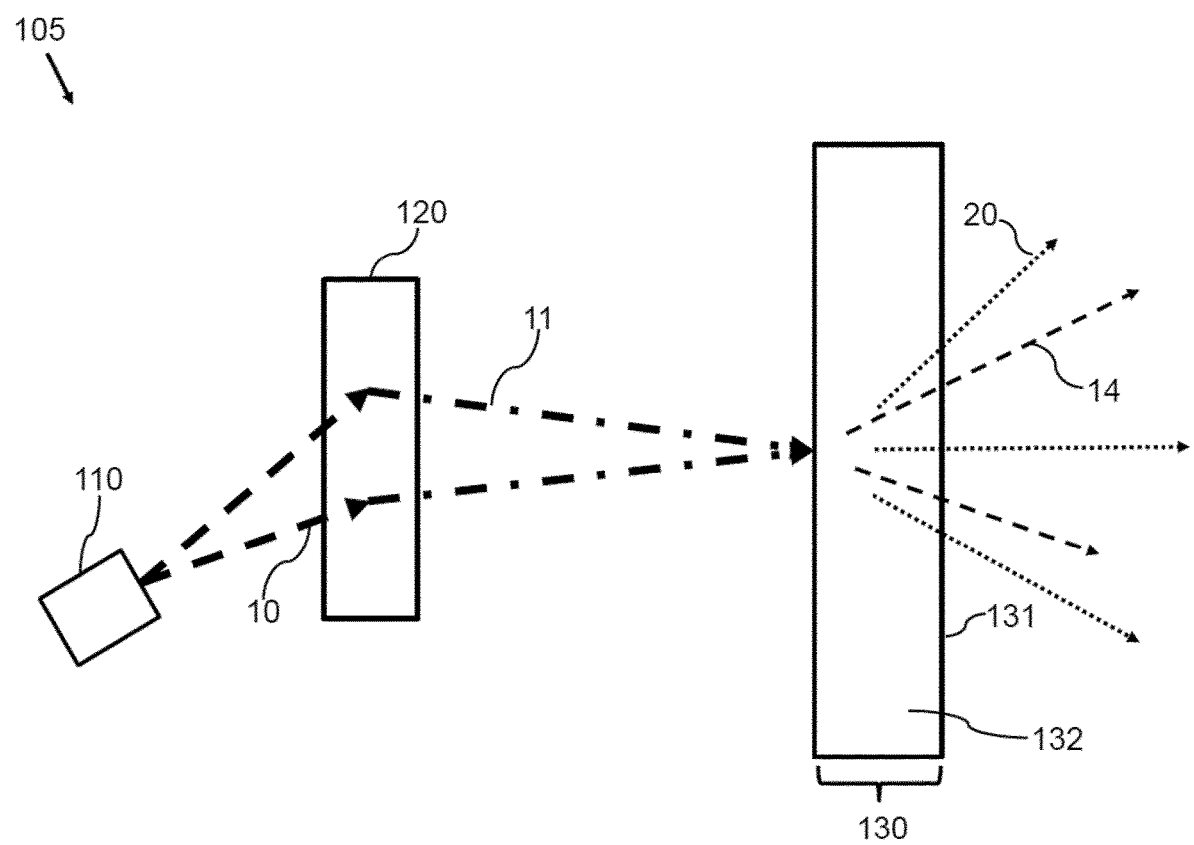

FIG. 2 shows a principal sketch of a second not claimed laser lighting module 105. A laser 110 emits laser light 10 to a holographic optical device 120 which is transmissive and transforms the entire laser light 10 to first transformed laser light 11. The first transformed laser light 11 is focused and imaged by means of the holographic optical device 120 to a light conversion device 130. The light conversion device 130 comprises a light converter 132. The light converter 132 is arranged in a transmissive arrangement. The first transformed laser light 11 illuminates a first surface of the light converter 132 with a predetermined intensity pattern such that a predetermined intensity pattern of converted light 20 is generated and emitted via an light emission surface 131 opposite to the first surface of the light converter 132. A part of the first transformed laser light 11 is transmitted via the light conversion device 130 and emitted at the light emission surface 131 such that a mixture of transmitted laser light 14 and converted light 20 is emitted via the light emission surface 131. All first transformed laser light 11 may be converted in an alternative setup.

Figure 3:
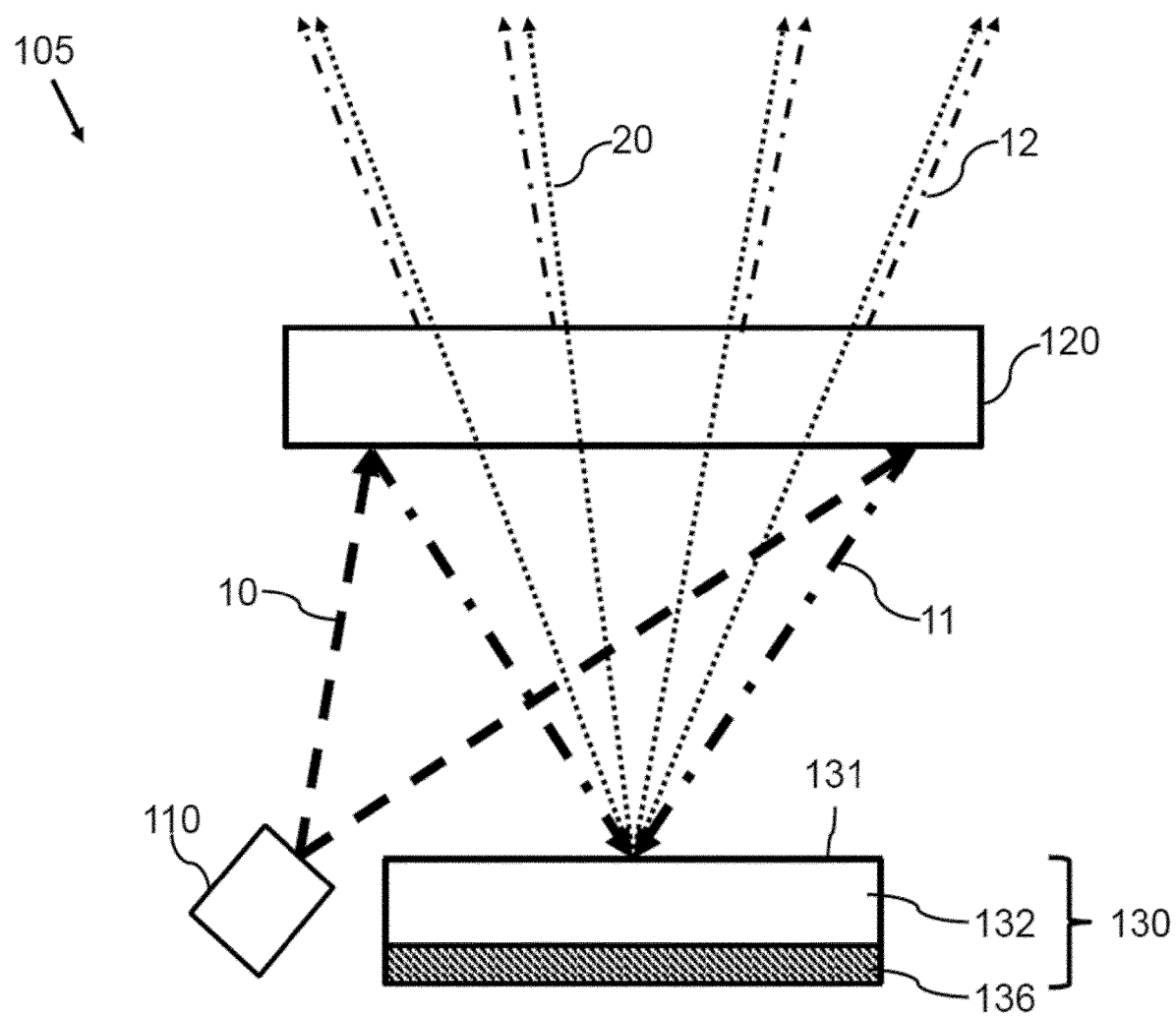

FIG. 3 shows a principal sketch of a first embodiment of an inventive laser lighting module 105. A laser 110 and light conversion device 130 are arranged on a same first side of holographic optical device 120. The holographic optical device 120 reflects and transforms a first part of laser light 10 emitted by the laser 110. Such first transformed laser light 11 is received at a light emission surface 131 of the light conversion device 130 which is arranged in a similar way as discussed with respect to FIG. 1. The difference is that the light converter 130 is in this case arranged to convert essentially all first transformed laser light 11 to converted light 20 (e.g. by a thicker light converter 130 and/or a different doping). A second part of the laser light 10 traverses the holographic optical device 120 and is converted to second transformed laser light 12. The holographic optical device 120 transforms the remaining part of the laser light 10 to second transformed laser light 12 such that an illumination pattern of the second transformed laser light 12 matches an illumination pattern of the converted light 20 emitted from the light emission surface 131 of the light conversion device 130. A mixture of the second transformed (e.g. blue) laser light 12 and the (e.g. yellow) converted light 20 is emitted via a second surface of the holographic optical device 120 wherein the second surface is opposite to the first surface of the holographic optical device 120.

Figure 4:
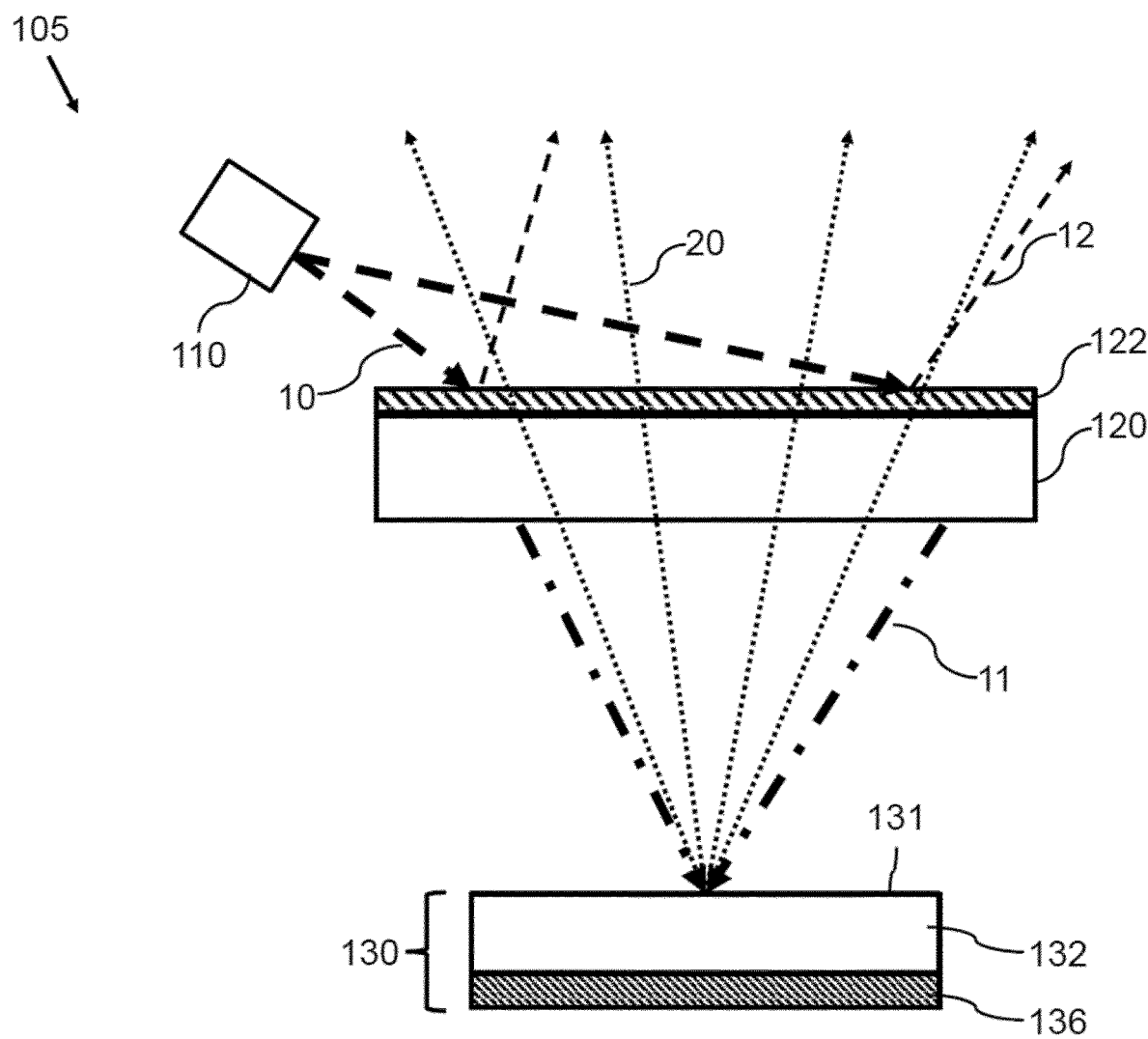

FIG. 4 shows a principal sketch of a second embodiment of an inventive laser lighting module 105. A light conversion device 130 similar to the light conversion device 130 discussed with respect to FIG. 3 is arranged on a first side of a holographic optical device 120. A laser 110 is arranged on a second side of the holographic optical device 120. A reflective structure 122 is arranged between the laser 110 and the second side of the holographic optical device. The reflective structure 122 is a dichroic mirror comprising a multitude of thin layers with alternating refractive index which are attached to the second side of the holographic optical device 120. A first part of the laser light 10 passes the dichroic mirror 122 and is transformed by means of the holographic optical device 120 to first transformed laser light 11 illuminating the light converter 132 of the light converting device 130 as described above. The first transformed laser light 11 is fully converted to converted light 20 which is emitted from the light emission surface 131 in the direction of the holographic optical device 120. A second part of the laser light 10 is reflected by means of the reflective structure 122. The converted light 20 passes the holographic optical device 120 and the narrowband dichroic mirror 122 essentially without any interaction such that a mixture of reflected laser light 12 and converted light 20 is emitted by the laser lighting module 105.

Figure 5:
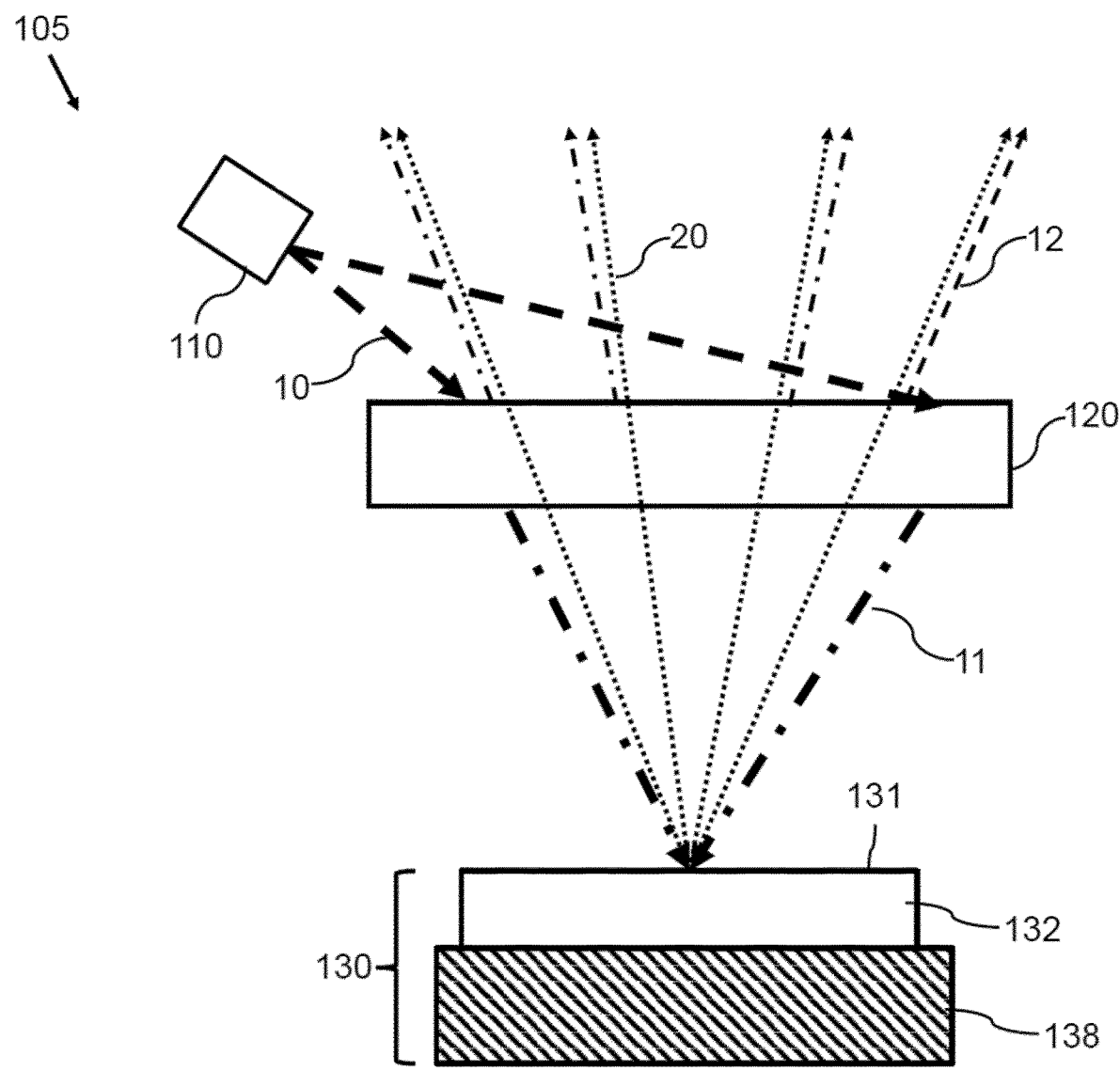

FIG. 5 shows a principal sketch of a third embodiment of an inventive laser lighting module 105. The configuration is similar to the configuration discussed with respect to FIG. 4. The holographic optical device 120 is in this case arranged to reflect the remaining part of the laser light 10 and to transform such remaining part of the laser light 10 to second transformed laser light 12. The light distribution of the second transformed laser light 12 is adapted by means of the holographic optical device 120 to a light distribution of the converted light 20 similar as discussed with respect to FIG. 3. The light conversion device 130 comprises in this case a light converter 132 and a heatsink 138. The light converter 132 is again a thin sheet of phosphor material which is attached to the heatsink 138 at a surface opposite to the light emission surface 131. The surface of the heatsink 138 attached to the light converter 132 is reflective with respect to the converted light 20. Light in the wavelength range of the laser light 10 is absorbed by means of the heatsink 138 such that only the converted light 20 is emitted via the light emission surface 131.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
11 first transformed laser light
12 second transformed laser light
13 reflected laser light
14 transmitted laser light
20 converted light
105 laser lighting module
110 laser
120 holographic optical device
122 reflective structure
130 light conversion device
131 light emission surface
132 light converter
136 reflective back structure
138 heatsink

The invention claimed is:

1. A laser lighting module for a vehicle headlight comprising:
at least one laser, wherein the at least one laser is adapted to emit laser light,
a holographic optical device, and
a light conversion device,
wherein
the holographic optical device is arranged to transform at least a part of the laser light to first transformed laser light such that the first transformed laser light is focused on the light conversion device, and such that a predefined intensity distribution of the laser light is provided by means of the first transformed laser light on the light conversion device,
the light conversion device comprises a light converter, wherein the light converter is adapted to convert the first transformed laser light to converted light, wherein a peak emission wavelength of the converted light is in a longer wavelength range than a laser peak emission wavelength of the first transformed laser light,
the holographic optical device is arranged in an emission path of the converted light emitted by the light conversion device, and wherein the holographic optical device is transparent with respect to the converted light, and wherein
the laser and the light conversion device are arranged on a same first side of the holographic optical device, wherein the holographic optical device is arranged to reflect the part of the laser light as the first transformed laser light to the light conversion device, and
the holographic optical device is arranged to transform at least another part of the laser light to second transformed laser light traversing the holographic optical device, and wherein the holographic optical device is arranged such that a mixture of the second transformed laser light and the converted laser light leaves a second side of the holographic optical device opposite to the first side.

2. A laser lighting module for a vehicle headlight, comprising:
at least one laser, wherein the at least one laser is adapted to emit laser light,
a holographic optical device, and
a light conversion device,
wherein
the holographic optical device is arranged to transform at least a part of the laser light to first transformed laser light such that the first transformed laser light is focused on the light conversion device, and such that a predefined intensity distribution of the laser light is provided by means of the first transformed laser light on the light conversion device,
the light conversion device comprises a light converter, wherein the light converter is adapted to convert the first transformed laser light to converted light, wherein a peak emission wavelength of the converted light is in a longer wavelength range than a laser peak emission wavelength of the first transformed laser light,
the holographic optical device is arranged in an emission path of the converted light emitted by the light conversion device, and wherein the holographic optical device is transparent with respect to the converted light, and wherein
the light conversion device is arranged on a first side of the holographic optical device, wherein the laser is arranged on a second side of the holographic optical device, wherein the second side is opposite to the first side, and wherein the holographic optical device is arranged to transmit the part of the laser light as the first transformed laser light to the light conversion device, and
the holographic optical device is arranged to transform at least another part of the laser light to second transformed laser light reflected by the holographic optical device, and wherein the holographic optical device is arranged such that a mixture of the second transformed laser light and the converted laser light is emitted via the second side of the holographic optical device.

3. The laser lighting module according to claim 1, wherein the holographic optical device is arranged such that a light distribution of the second transformed laser light coincides with a light distribution of the converted laser light traversing the holographic optical device.

4. A vehicle headlight comprising at least one laser lighting module according to claim 1, the vehicle headlight further comprising imaging optics to image light received from the at least one laser lighting module.

* * * * *